(12) United States Patent
Khang et al.

(10) Patent No.: US 8,618,538 B2
(45) Date of Patent: Dec. 31, 2013

(54) THIN FILM TRANSISTOR ARRAY PANEL AND MANUFACTURING METHOD THEREOF

(75) Inventors: Yoon Ho Khang, Yongin-si (KR); Se Hwan Yu, Seoul (KR); Chong Sup Chang, Hwaseong-si (KR); Sang Ho Park, Suwon-si (KR); Su-Hyoung Kang, Bucheon-si (KR)

(73) Assignee: Samsung Display Co., Ltd., Yongin (KR)

( * ) Notice: Subject to any disclaimer, the term of this patent is extended or adjusted under 35 U.S.C. 154(b) by 151 days.

(21) Appl. No.: 13/099,108

(22) Filed: May 2, 2011

(65) Prior Publication Data

US 2012/0138920 A1 Jun. 7, 2012

(30) Foreign Application Priority Data

Dec. 1, 2010 (KR) ........................ 10-2010-0121337

(51) Int. Cl.
*H01L 29/12* (2006.01)
*H01L 29/45* (2006.01)
*H01L 29/786* (2006.01)
*H01L 21/336* (2006.01)

(52) U.S. Cl.
USPC 257/43; 257/59; 257/E29.143; 257/E21.476; 438/104

(58) Field of Classification Search
None
See application file for complete search history.

(56) References Cited

U.S. PATENT DOCUMENTS

| 8,158,466 | B2 * | 4/2012 | Kim et al. | 438/149 |
| 2009/0250693 | A1 * | 10/2009 | Jeong et al. | 257/43 |
| 2010/0181565 | A1 * | 7/2010 | Sakata et al. | 257/43 |
| 2010/0207117 | A1 * | 8/2010 | Sakata et al. | 257/43 |

OTHER PUBLICATIONS

Sung-Hwan Choi; Min-Koo Han; , "Effect of Deposition Temperature of SiOx Passivation Layer on the Electrical Performance of a-IGZO TFTs," Electron Device Letters, IEEE , vol. 33, No. 3, pp. 396-398, Mar. 2012.*

Liu, Shou-En; Yu, Ming-Jiue; Lin, Chang-Yu; Ho, Geng-Tai; Cheng, Chun-Cheng; Lai, Chih-Ming; Lin, Chrong-Jung; King, Ya-Chin; Yeh, Yung-Hui, "Influence of Passivation Layers on Characteristics of a-InGaZnO Thin-Film Transistors", IEEE Electron Device Letters, vol. 32, issue 2, pp. 161-163.*

Kang, Jiyeon; Moon, Kyeong-Ju; Lee, Tae Il; Lee, Woong; Myoung, Jae-Min, "Migration of indium ions in amorphous indium-gallium-zinc-oxide thin film transistors", Applied Surface Science, vol. 258, Issue 8, p. 3509-3512 Dec. 1, 2011.*

(Continued)

*Primary Examiner* — Thomas L Dickey
*Assistant Examiner* — Joseph Schoenholtz
(74) *Attorney, Agent, or Firm* — H.C. Park & Associates, PLC (57) ABSTRACT

A thin film transistor array panel is provided that includes: a gate electrode that is disposed on an insulating substrate; a gate insulating layer that is disposed on the gate electrode; an oxide semiconductor that is disposed on the gate insulating layer; a blocking layer that is disposed on the oxide semiconductor; a source electrode and a drain electrode that are disposed on the blocking layer; a passivation layer that is disposed on the source electrode and drain electrode; and a pixel electrode that is disposed on the passivation layer. The blocking layer includes a first portion that is covered by the source electrode and drain electrode and a second portion that is not covered by the source electrode and drain electrode, and the first portion and the second portion include different materials.

15 Claims, 14 Drawing Sheets

(56) References Cited

OTHER PUBLICATIONS

Sung-Hwan Choi; Min-Koo Han;, "Effect of Deposition Temperature of SiOx Passivation Layer on the Electrical Performance of a-IGZO TFTs," Electron Device Letters, IEEE, vol. 33, No. 3, pp. 396-398, Mar. 2012.*

Liu, Shou-En; Yu, Ming-Jiue; Lin, Chang-Yu; Ho, Geng-Tai; Cheng, Chun-Cheng; Lai, Chih-Ming; Lin, Chrong-Jung; King, Ya-Chin; Yeh, Yung-Hui, "Influence of Passivation Layers on Characteristics of a-InGaZnO Thin-Film Transistors", IEEE Electron Device Letters, vol. 32, issue 2, (Feb. 2011): pp. 161-163.*

Kang, Jiyeon; Moon, Kyeong-Ju; Lee, Tae Il; Lee, Woong; Myoung, Jae-Min, "Migration of indium ions in amorphous indium-gallium-zinc-oxide thin film transistors", Applied Surface Science, vol. 258, Issue 8, (2012): pp. 3509-3512.*

Kim, Minkyu, Jong Han Jeong, Hun Jung Lee, Tae Kyung Ahn, Hyun Soo Shin, Jin-Seong Park, Jae Kyeong Jeong, Yeon-Gon Mo, and Hye Dong Kim. "High Mobility Bottom Gate InGaZnO Thin Film Transistors with SiOx Etch Stopper." Applied Physics Letters 90.21 (2007): 212114.*

\* cited by examiner

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2010-0121337, filed on Dec. 1, 2010, which is hereby incorporated by reference for all purposes as if fully set forth herein.

BACKGROUND OF THE INVENTION

1. Field of the Invention

The present invention relates to a thin film transistor array panel and a manufacturing method thereof.

2. Description of the Related Art

Liquid crystal displays are currently one of the most widely used type of flat panel displays. A liquid crystal display includes two display panels, on which electrodes are formed to control liquid crystal molecules disposed there between, by applying the voltage to the electrodes.

A thin film transistor (TFT) array panel is one of the two display panels constituting the liquid crystal display and is used as a circuit board for independently driving each pixel in the liquid crystal display or in an organic electro luminescence (EL) display device. The thin film transistor array panel includes a scanning signal wire or a gate wire that transmits a scanning signal, an image signal line or a data wire that transmits an image signal, a thin film transistor that is connected to the gate wire and the data wire, a pixel electrode that is connected to the thin film transistor, a gate insulating layer that covers the gate wire, and an interlayer insulating layer that covers the thin film transistor and the data wire.

Each layer of a thin film transistor array panel is formed using a photosensitive film. The pattern of each layer is formed by etching the films and then using the etched film as a mask.

An oxide semiconductor is generally used to form components of an array panel. In order to reduce damage of the oxide semiconductor by an etching solution, when a source electrode and a drain electrode are formed, an etching prevention layer is formed on the semiconductor layer, and a mask for forming the etching prevention layer is needed. As such, manufacturing costs are increased and a manufacturing process is complicated.

The above information disclosed in this Background section is only for enhancement of understanding of the background of the invention and therefore it may contain information that does not constitute prior art.

SUMMARY OF THE INVENTION

Aspects of the present invention provide a thin film transistor array panel having reduced manufacturing costs and manufacturing steps, when an oxide semiconductor is used in a thin film transistor, and a manufacturing method thereof. Additional features of the invention will be set forth in the description which follows, and in part will be apparent from the description, or may be learned by practice of the invention.

An exemplary embodiment of the present invention provides a thin film transistor array panel including: a gate electrode that is disposed on an insulating substrate; a gate insulating layer that is disposed on the gate electrode; an oxide semiconductor that is disposed on the gate insulating layer; a blocking layer that is disposed on the oxide semiconductor; a source electrode and a drain electrode that are disposed on the blocking layer; a passivation layer that is disposed on the source electrode and drain electrode; and a pixel electrode that is disposed on the passivation layer. The blocking layer includes a first portion that is covered by the source electrode and drain electrode and a second portion that is not covered by the source electrode and drain electrode, and the first portion and the second portion include different materials.

Another exemplary embodiment of the present invention provides a method for manufacturing a thin film transistor array panel, the method including: forming a gate electrode on an insulating substrate; forming a gate insulating layer on the gate electrode; forming an oxide semiconductor on the gate insulating layer; forming a blocking layer on the oxide semiconductor; forming a source electrode and a drain electrode on the blocking layer; forming a passivation layer on the source electrode and drain electrode; and forming a pixel electrode on the passivation layer. The oxide semiconductor, the blocking layer, and the source and drain electrodes are formed using a single photolithography process. The blocking layer includes a first portion that is covered by the source electrode and drain electrode and a second portion that is not covered by the source electrode and drain electrode, and the first portion and the second portion include different materials.

According to the exemplary embodiments of the present invention, since an insulating layer that covers a semiconductor layer operates as an etching stop layer, as separate mask is not needed, manufacturing costs are reduced, and a manufacturing process is simplified.

Additional features of the invention will be set forth in the description which follows, and in part will be apparent from the description, or may be learned by practice of the invention.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, areas, etc., are exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 1:
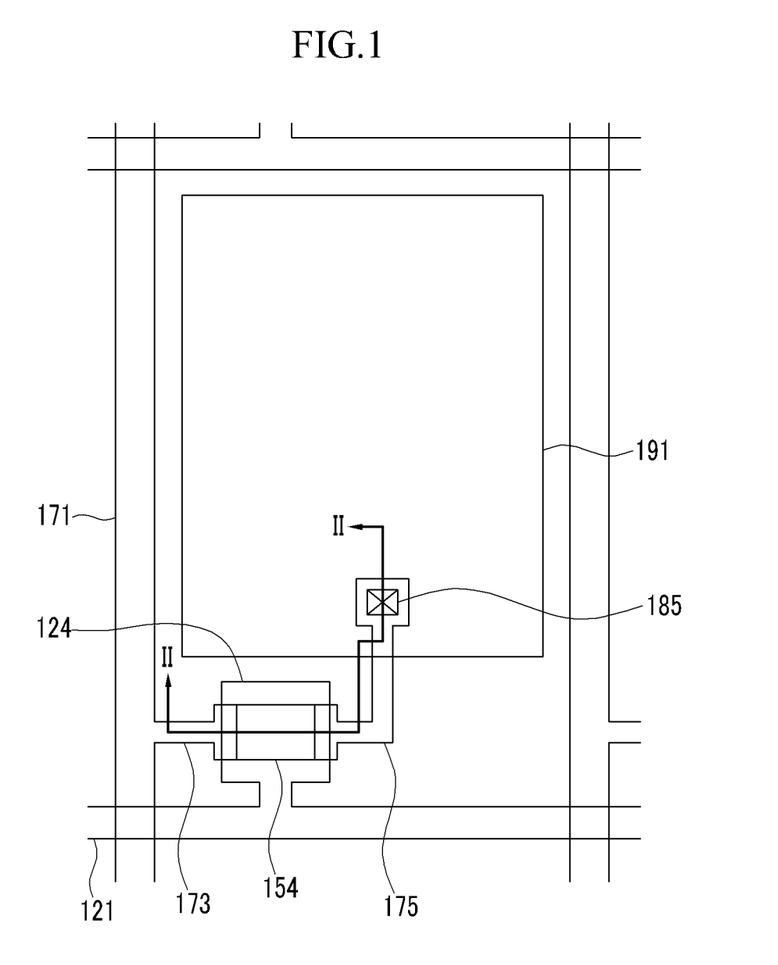
FIG. 1 is a layout view that illustrates one pixel of a thin film transistor array panel according to an exemplary embodiment of the present invention.
Figure 2:
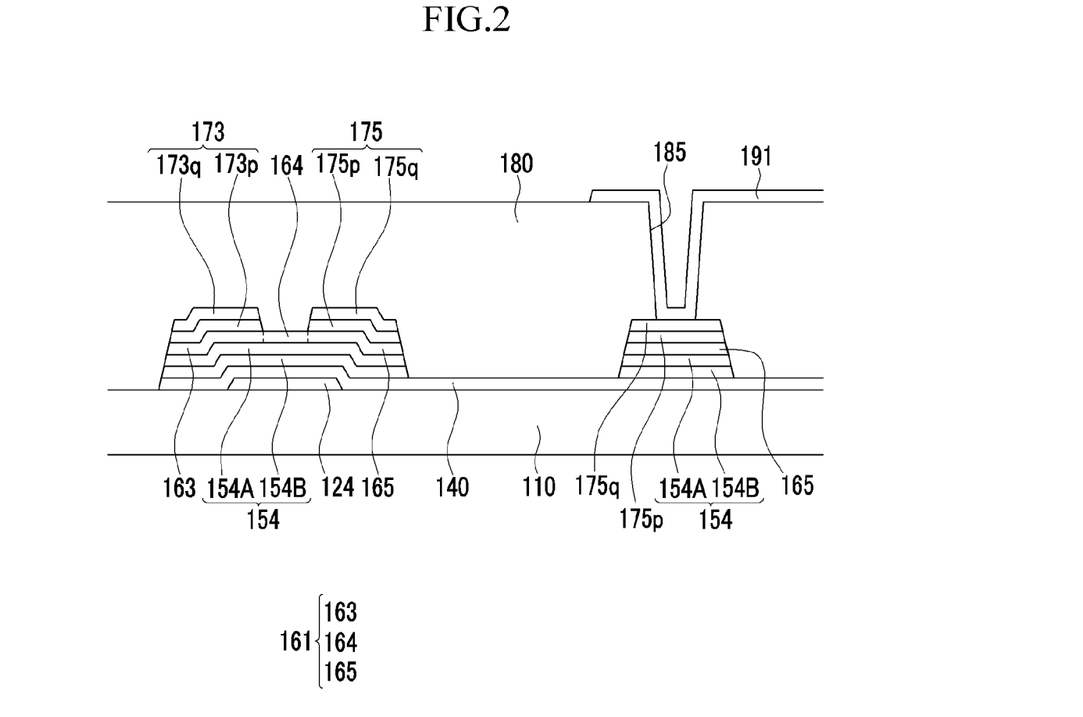
FIG. 2 is a cross-sectional view that is taken along the line II-II of FIG. 1.

FIG. 1 is a layout view that illustrates one pixel of a thin film transistor array panel, according to an exemplary embodiment of the present invention, and FIG. 2 is a cross-sectional view that is taken along the line II-II of FIG. 1. Referring to FIG. 1 and FIG. 2, gate lines 121 are formed on an insulating substrate 110. The insulating substrate 110 may be formed of a transparent material, such as glass or plastic.

The gate lines 121 transmit a gate signal and mainly extend in a horizontal direction. The gate lines 121 include gate electrodes 124 and an end portion having a wide area (not shown) for connection with another layer or an external driving circuit.

A gate insulating layer 140 is formed on the gate line 121. The gate insulating layer 140 may be formed of silicon nitride ($SiN_x$) or silicon oxide ($SiO_x$), for example. Semiconductors 154 are formed on the gate insulating layer 140. The semiconductors 154 may be formed of an oxide semiconductor material, such as, GIZO (gallium indium zinc oxide), ZTO (ZnSnO), and IZO (indium zinc oxide).

The semiconductor 154 may have a dual-layer structure. In particular, the semiconductor 154 may include a lower layer 154B that is formed of GIZO having a relatively high indium (In) content, and an upper layer 154A that is formed of GIZO having a relatively low indium content. As such, it is possible to reduce the generation of indium protrusions on surface of the semiconductor 154 that occur as a result of the manufacturing process.

In addition, the upper surface of the semiconductor 154 may be fluorinated. As such, it is possible to reduce the generation of the indium protrusions on the surface of the semiconductor layer 154 that occur during manufacturing.

A blocking layer 161 pattern is formed on the semiconductor 154. The blocking layer pattern 161 may include silicon (Si). Data lines 171 and drain electrodes 175 are formed on the blocking layer pattern 161.

The data lines 171 transmit a data signal, mainly extend in a vertical direction, and cross the gate lines 121. The data lines 171 include source electrodes 173 and an end portion having a wide area (not shown) for connection with another layer or external driving circuit.

The drain electrodes 175 are separated from the data lines 171 and face the source electrodes 173 across the gate electrodes 124. The data lines 171, source electrodes 173, and drain electrodes 175 may have a dual-layer structure. In particular, the data line 171, source electrode 173, and drain electrode 175 may include of lower layers 173p and 175p that include titanium (Ti), and upper layers 173q and 175q that include copper (Cu).

The blocking layer pattern 161 includes first portions 163 and 165 that are covered by the data line 171 or by the source electrode 173 and drain electrode 175, and a second portion 164 that is not covered. The first portions 163 and 165 may include amorphous silicon or a silicide, and the second portion 164 may include silicon oxide ($SiO_x$).

The source electrodes 173, drain electrodes 175, and semiconductors 154 form thin film transistors (TFTs). A channel of the semiconductor 154 is formed between the source electrode 173 and drain electrode 175.

A passivation layer 180 is formed on the data lines 171, drain electrodes 175, and the second portions 164. The passivation layer 180 may include inorganic insulators, such as silicon nitride or silicon oxide, an organic insulator, a low dielectric insulator, and the like. Contact holes 185 that expose ends of the drain electrodes 175 are formed in the passivation layer 180.

Pixel electrodes 191 are formed on the passivation layer 180. Each pixel electrode 191 is physically and electrically connected to one of the drain electrodes 175, through one of the contact holes 185. A data voltage from the drain electrode 175 is applied to the pixel electrode 191. The pixel electrode 191 generates an electric field that controls the orientation of liquid crystal molecules of the liquid crystal layer (not shown), in conjunction with the common electrodes (not shown) of the other display panel (not shown), to which the common voltage is applied. The pixel electrode 191 and common electrode form a capacitor (hereinafter, referred to as "a liquid crystal capacitor") to maintain the applied voltage after the thin film transistor is turned off.

The pixel electrode 191 may form a storage capacitor in conjunction with an overlapped storage electrode line (not shown). As such, the voltage storage ability of the liquid crystal capacitor may be increased. The pixel electrode 191 may be made of a transparent conductor, such as ITO or IZO.

Figure 3:
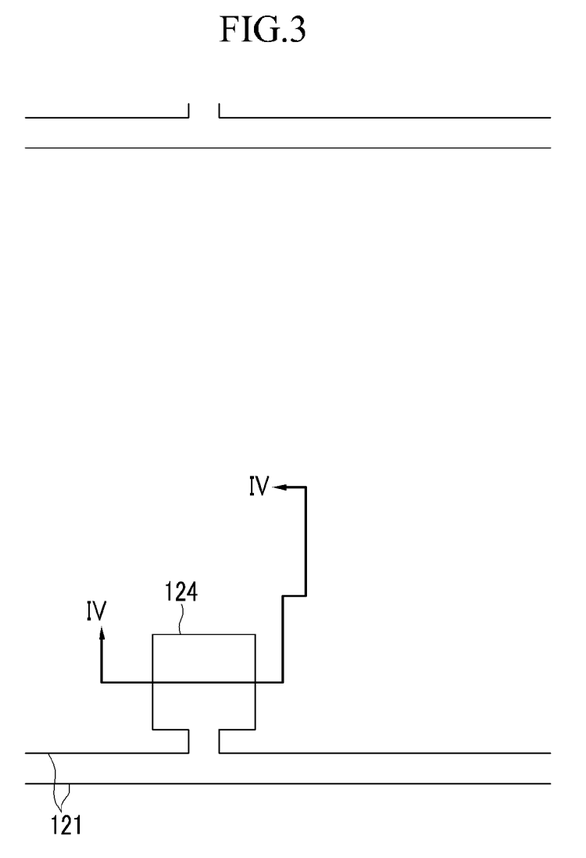
FIGS. 3, 5, and 8 are layout views that sequentially illustrate a manufacturing method of a thin film transistor array panel, according to an exemplary embodiment of the present invention.
Figure 4:
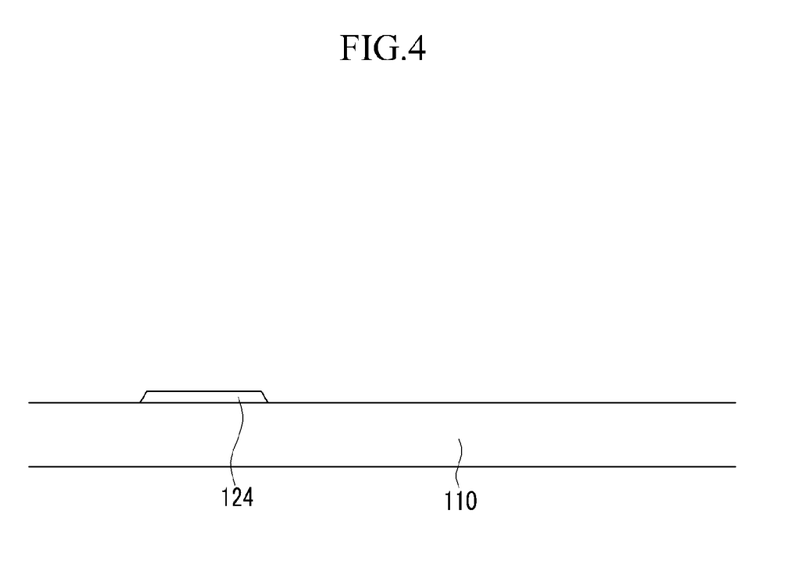
FIG. 4 is a cross-sectional view that is taken along the line IV-IV of the thin film transistor array panel of FIG. 3.
Figure 5:
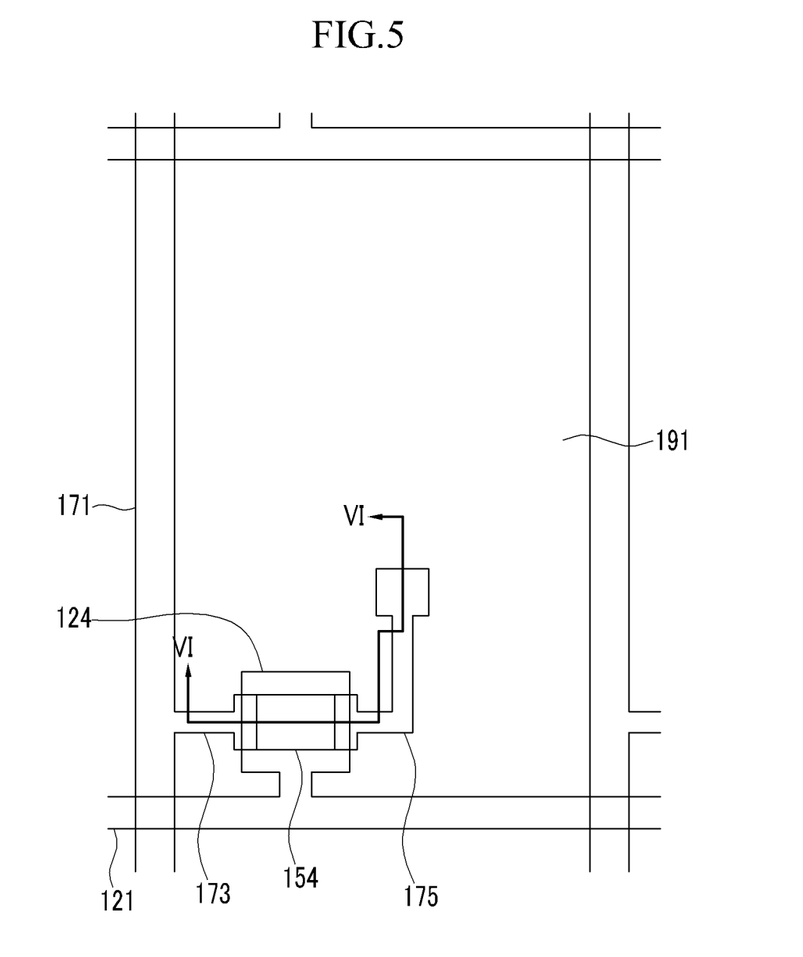
Figure 6:
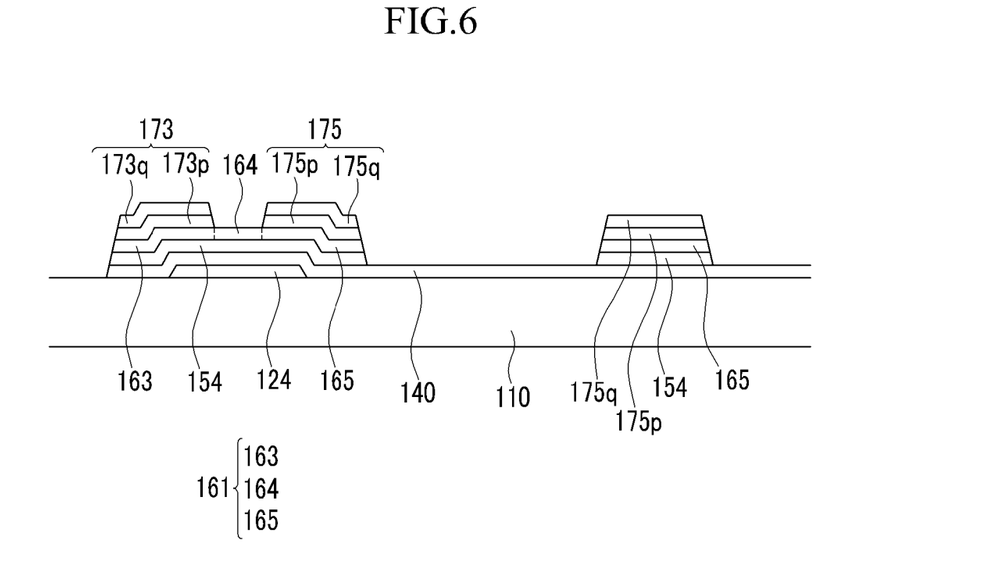
FIG. 6 is a cross-sectional view that is taken along the line IV-IV of the thin film transistor array panel of FIG. 5.
Figure 7A:
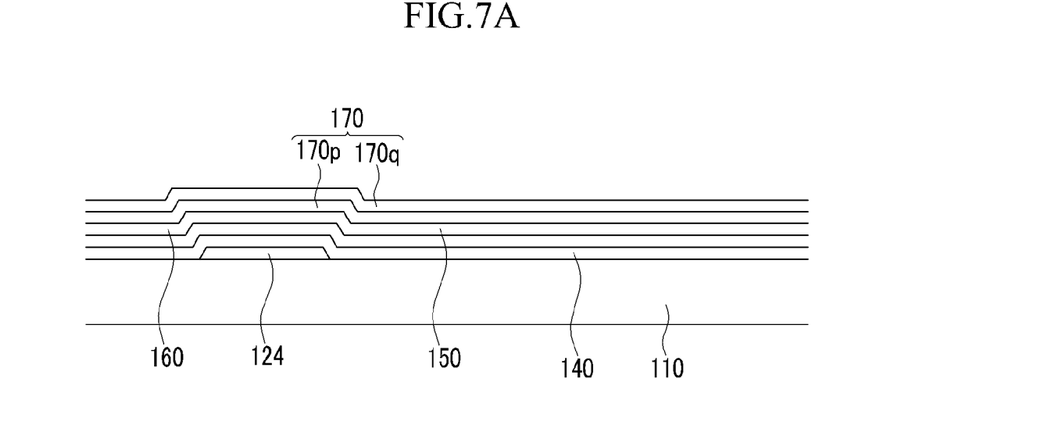
FIGS. 7A to 7F are cross-sectional views that sequentially illustrate a manufacturing method of a thin film transistor array panel according to an exemplary embodiment of the present invention.
Figure 7B:
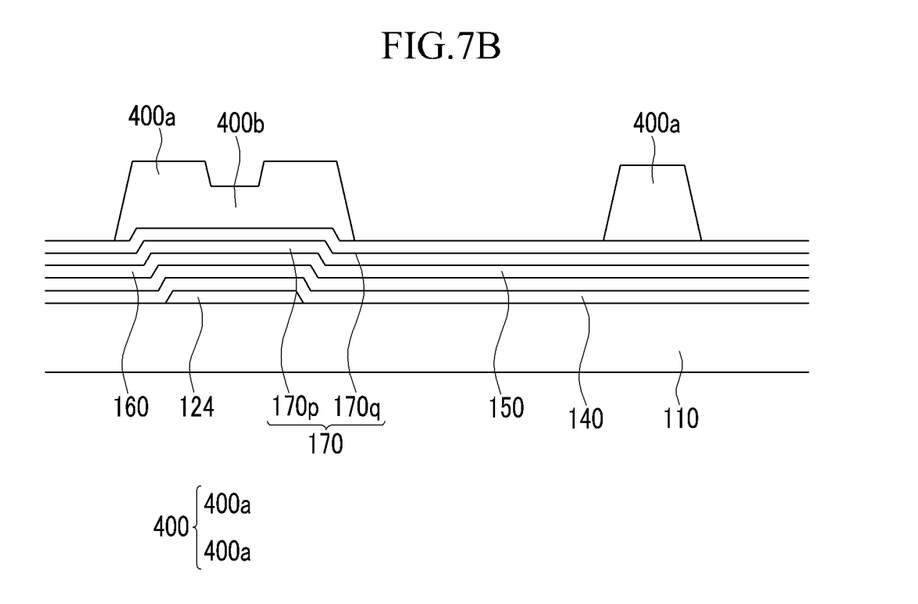
Figure 7C:
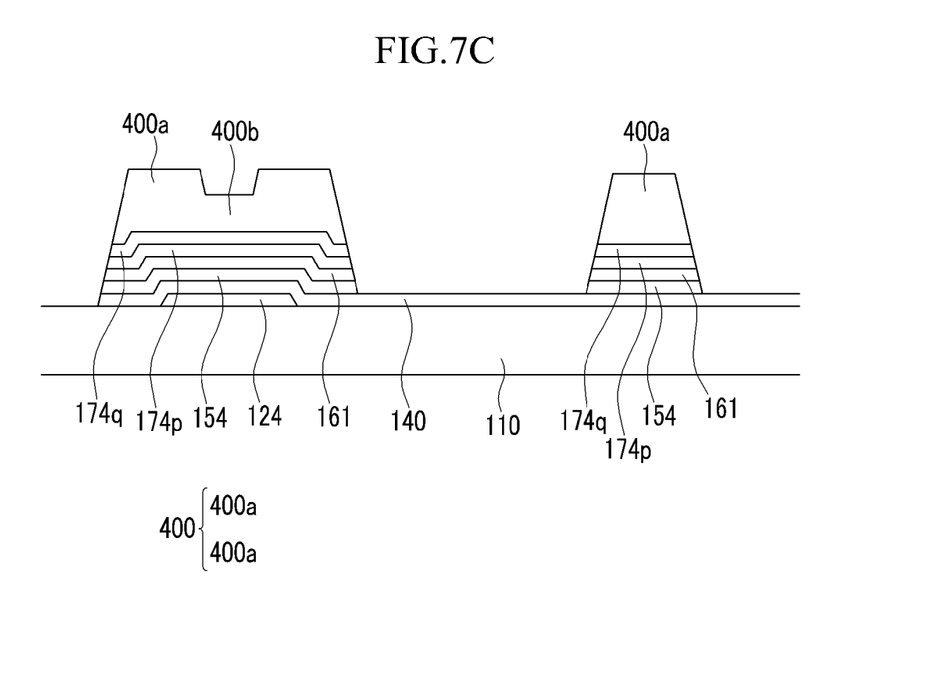
Figure 7D:
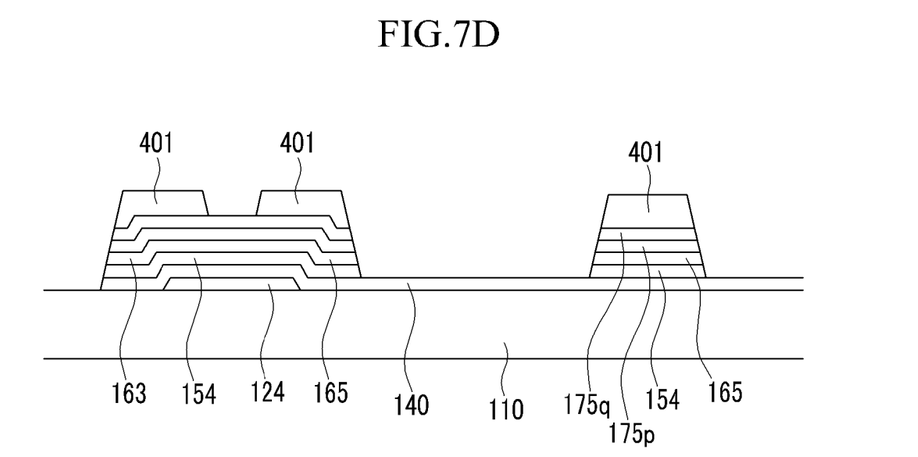
Figure 7E:
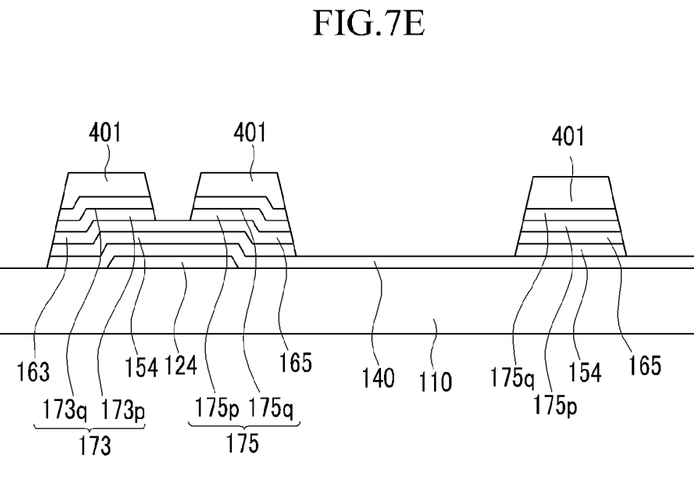
Figure 7F:
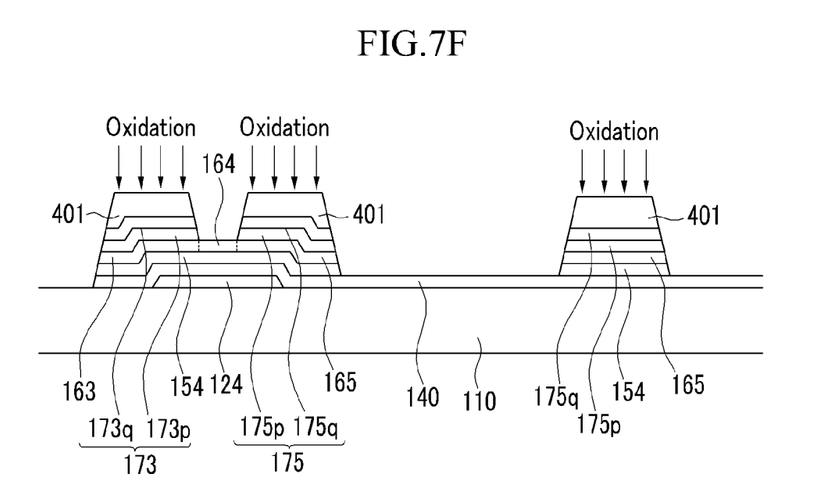
Figure 8:
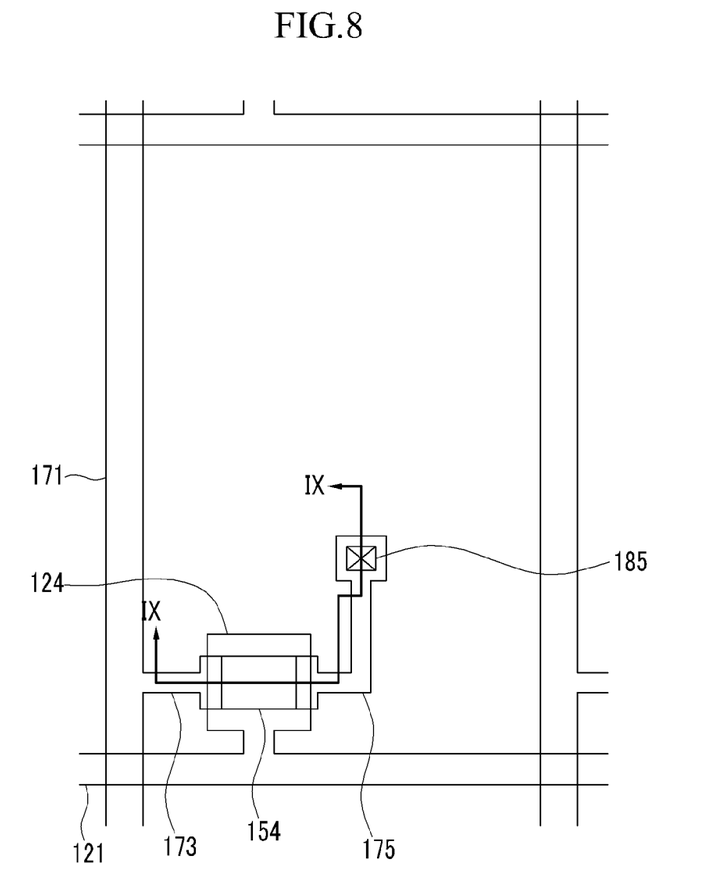

FIGS. 3, 5, and 8 are layout views that subsequently illustrate a manufacturing method of a thin film transistor array panel as shown in FIGS. 1 and 2, according to an exemplary embodiment of the present invention. FIGS. 4, 6, 7A to 7F, and 9 are cross-sectional views that subsequently illustrate a manufacturing method of a thin film transistor array panel, according to an exemplary embodiment of the present invention.

As shown in FIG. 3 and FIG. 4, after a metal layer is formed on the insulating substrate 110, a gate line that has a gate electrode 124 is formed by patterning the metal layer. Next, as shown in FIG. 5 and FIG. 6, the gate insulating layer 140, semiconductor layer 154, blocking portions 163, 164, and 165, data line 171, source electrode 173, and drain electrode 175 are formed.

Referring to FIGS. 7A to 7F, a method for forming the gate insulating layer 140, semiconductor layer 154, blocking portions 163, 164, and 165, data line 171, source electrode 173 and drain electrode 175 will be described in detail. As shown in FIG. 7A, the gate insulating layer 140, a semiconductor layer 150, a blocking layer 160, and a metal layer 170 are sequentially formed on the gate electrode 124.

The metal layer 170 includes a first metal layer 170a and a second metal layer 170q. The first metal layer 170a may include titanium (Ti), and the second metal layer 170q may include copper (Cu). The gate insulating layer 140 may include silicon nitride ($SiN_x$) or silicon oxide ($SiO_x$), the semiconductor layer 150 may be formed of an oxide semiconductor material, such as GIZO, ZTO (ZnSnO), or IZO. The semiconductor layer 150 may be formed of layers of the oxide semiconductor material that are deposited by vacuum deposition or by a coating method Although not shown in the drawing, the semiconductor layer 150 may have a dual-layer structure. In particular, the semiconductor layer 150 may include a lower layer that is formed of GIZO having a relatively high indium (In) content, and an upper layer that is formed of GIZO having a relatively low indium content. In addition, the upper surface of the semiconductor layer 150 may be fluorinated.

As shown in FIG. 7B, a first photosensitive film pattern 400, including a first portion 400a and a second portion 400b that have different thicknesses, is formed by coating a photosensitive film on the second metal layer 170q, then exposing and developing the film. The first portion 400a is disposed on the wiring part and is thicker than the second portion 400b, which is disposed on the channel part. The ratio of the thickness of the first portion 400a to the thickness of the second portion 400b can be controlled, by controlling the conditions of an etching process that will be described later. The thickness of the second portion 400b may be about ½ or less than the thickness of the first portion 400a.

The photosensitive film 400 may be formed by various methods, such that the portions 400a and 400b have the different thicknesses. For example, a film could be patterned using a mask having a transparent area, a light blocking area, and a semi-transparent. The semi-transparent area may include a slit pattern, a lattice pattern, or a thin film that has is semi-transparent. When the slit pattern is used, width of the slits or an interval between the slits is smaller than the resolution of a light source used in a photolithography process. As another example, a photosensitive film that can reflow may be used. That is, after the photosensitive film pattern that can reflow is formed using a general mask that has only a transparent area and a light blocking area. Then, the reflow is performed, such that the photosensitive film pattern is allowed to flow, thus forming thinner portions and thicker portions.

As shown in FIG. 7C, the metal layer 170, the blocking layer 160, and the semiconductor layer 150 are etched, using the first photosensitive film pattern 400 a mask. Accordingly, the blocking pattern 167, the first metal pattern 174a, the second metal pattern 174b and the semiconductor pattern 154 are formed.

As shown in FIG. 7D, an etch-back process is performed on the first photosensitive film pattern 400. As a result, the second portion 400b is removed, and the first portion 400a is reduced in thickness, thereby forming a second photosensitive film pattern 401.

As shown in FIG. 7E, the first metal pattern 174a and the second metal pattern 174b are etched, using the second photosensitive film pattern 401 as a mask. As a result, the source electrode 173 and drain electrode 175, which include the upper layers 173b and 175b and lower layers 173a and 175a, are formed.

Referring to FIG. 7F, an oxidation process is performed and the second photosensitive film pattern 401 is removed. The oxidation process may be performed before or after the photosensitive film pattern 401 is removed. As a result, the second portion 164 of the blocking layer 161 is formed. In particular, the oxidation process results in the second portion 164 being formed of silicon oxide ($SiO_x$).

The first portions 163 and 165 may include amorphous silicon or silicide, and the second portion 164 may include silicon oxide ($SiO_x$). As such, it is possible to reduce manufacturing costs and manufacturing steps, by forming the blocking layer 161 on the semiconductor pattern 154, which prevents damage to the semiconductor pattern 154, due to the layering and oxidizing of silicon layers. Thus, an additional mask is not needed.

Figure 9:
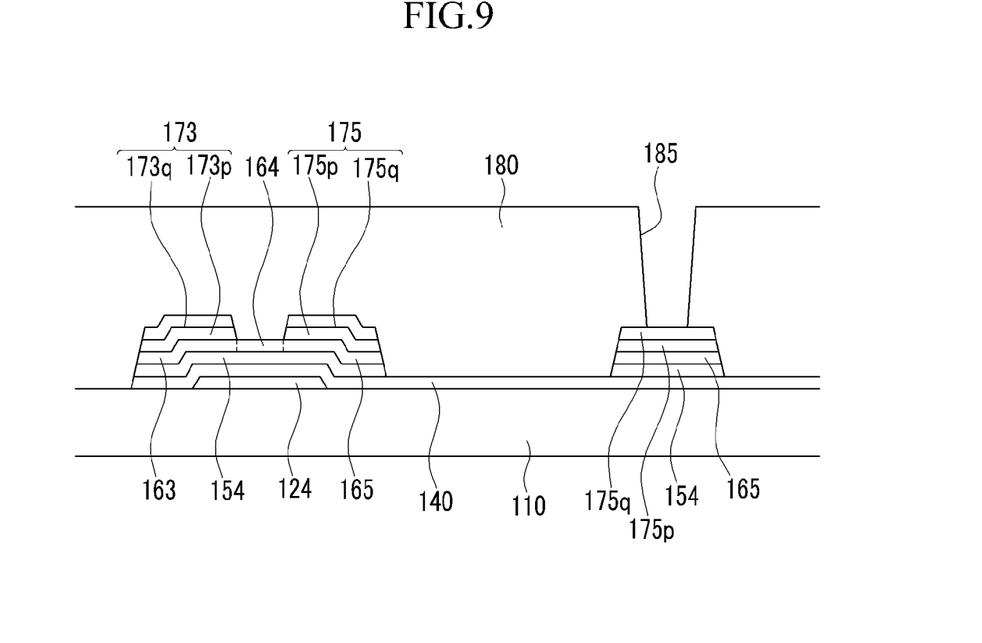
FIG. 9 is a cross-sectional view that is taken along the line IX-IX of the thin film transistor array panel of FIG. 8.

Next, as shown in FIG. 8 and FIG. 9, a passivation layer 180 is formed on the resultant structure. A contact hole 185 exposing the drain electrode 175 is formed in the passivation layer 180. Thereafter, as shown in FIG. 1 and FIG. 2, a pixel electrode 191 is formed that is connected to the drain electrode 175 through the contact hole 185.

In the exemplary embodiment of the present invention, since the semiconductor layer, blocking layer, source electrode, and drain electrode are simultaneously formed without using separate masks, manufacturing costs and processing steps are reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
   a gate electrode disposed on a substrate;
   a gate insulating layer disposed on the gate electrode;
   an oxide semiconductor disposed on the gate insulating layer;
   a blocking layer disposed on the oxide semiconductor;
   a source electrode and a drain electrode disposed on the blocking layer;
   a passivation layer disposed on the source electrode and drain electrode; and
   a pixel electrode disposed on the passivation layer, wherein,
   the blocking layer comprises a first portion that is covered by the source electrode and the drain electrode, and a second portion that is disposed on a channel region of the oxide semiconductor,
   the first portion of the blocking layer pattern comprises a silicide or amorphous silicon,
   the second portion of the blocking layer pattern comprises silicon oxide ($SiO_x$), and
   the silicon oxide ($SiO_x$) content of the second portion is greater than the silicon oxide ($SiO_x$) content of the first portion.

2. The thin film transistor array panel of claim 1, wherein the second portion of the blocking layer is electrically insulating.

3. The thin film transistor array panel of claim 1, wherein the oxide semiconductor layer comprises gallium indium zinc oxide (GIZO).

4. The thin film transistor array panel of claim 1, wherein the oxide semiconductor layer comprises:
   a lower layer that comprises gallium indium zinc oxide (GIZO); and
   an upper layer that comprises GIZO, the upper layer having a lower indium content than the lower layer.

5. The thin film transistor array panel of claim 1, wherein the source electrode and drain electrode each comprise a lower layer and an upper layer.

6. The thin film transistor array panel of claim 5, wherein:
   the lower layer comprises titanium (Ti) and
   the upper layer comprises copper (Cu).

7. The thin film transistor array panel of claim 1, wherein the oxide semiconductor layer comprises gallium indium zinc oxide (GIZO), ZnSnO (ZTO), or indium zinc oxide (IZO).

8. The thin film transistor array panel of claim 7, wherein the oxide semiconductor layer comprises:
   a lower layer that comprises GIZO; and
   an upper layer that comprises GIZO, the upper layer having a lower indium content than the lower layer.

9. A method for manufacturing a thin film transistor array panel, comprising:

forming a gate electrode on a substrate;
forming a gate insulating layer on the gate electrode;
forming an oxide semiconductor layer on the gate insulating layer;
forming a blocking layer on the oxide semiconductor layer;
forming a metal layer on the blocking layer;
forming a first photosensitive film pattern on the metal layer;
etching the metal layer, the blocking layer, and the oxide semiconductor layer, using the first photosensitive film pattern as a mask, to form a metal layer pattern, a blocking layer pattern, and an oxide semiconductor layer pattern;
performing an etch-back process on the first photosensitive film pattern, so as to form a second photosensitive film pattern that comprises an opening disposed above a channel region of the oxide semiconductor layer pattern;
etching the metal layer through the opening, to form a source electrode and a drain electrode on the blocking layer;
oxidizing a portion of the blocking layer pattern that is disposed above the channel region of the oxide semiconductor layer pattern, such that the oxide semiconductor layer pattern has a first portion that is not oxidized and a second portion that is oxidized;
forming a passivation layer on the source electrode and the drain electrode; and
forming a pixel electrode on the passivation layer, wherein,
the first portion of the blocking layer pattern comprises a silicide or amorphous silicon,
the second portion of the blocking layer pattern comprises silicon oxide ($SiO_x$), and
the silicon oxide ($SiO_x$) content of the second portion is greater than the silicon oxide ($SiO_x$) content of the first portion.

10. The method of claim 9, wherein the first photosensitive film pattern comprises:
a first portion having a first thickness; and
a second portion having a second thickness that is less than the first thickness.

11. The method of claim 10, wherein the second portion of the first photosensitive film pattern is disposed over the channel region.

12. The method of claim 10, wherein the thickness of the second photosensitive film pattern is less than the thickness of the first portion of the first photosensitive film pattern.

13. The method of claim 9, wherein the oxide semiconductor layer pattern comprises gallium indium zinc oxide (GIZO), ZnSnO (ZTO), or indium zinc oxide (IZO).

14. The method of claim 9, wherein the oxide semiconductor layer pattern comprises:
a lower layer that comprises gallium indium zinc oxide (GIZO); and
an upper layer that comprises GIZO, the upper layer having a lower indium content than the lower layer.

15. The method of claim 9, wherein the source electrode and drain electrode each comprise:
a lower layer that comprises titanium (Ti); and
an upper layer that comprises copper (Cu).

* * * * *